US008377790B2

(12) United States Patent
Kanike et al.

(10) Patent No.: US 8,377,790 B2
(45) Date of Patent: Feb. 19, 2013

(54) METHOD OF FABRICATING AN EMBEDDED POLYSILICON RESISTOR AND AN EMBEDDED EFUSE ISOLATED FROM A SUBSTRATE

(75) Inventors: Narasimhulu Kanike, Wayne, NJ (US); Mark R. Visokay, Wappingers Falls, NY (US); Oh-Jung Kwon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/014,995

(22) Filed: Jan. 27, 2011

(65) Prior Publication Data
US 2012/0196423 A1  Aug. 2, 2012

(51) Int. Cl.
*H01L 21/20*  (2006.01)
(52) U.S. Cl. .... 438/382; 438/238; 438/404; 57/E21.004
(58) Field of Classification Search .................. 438/238, 438/382, 404
See application file for complete search history.

(56) References Cited

U.S. PATENT DOCUMENTS

| | | | |
|---|---|---|---|
| 5,677,228 A | 10/1997 | Tseng | |
| 5,773,871 A | 6/1998 | Boyd et al. | |
| 6,069,398 A | 5/2000 | Kadosh et al. | |
| 6,368,902 B1 | 4/2002 | Kothandaraman et al. | |
| 6,406,956 B1 | 6/2002 | Tsai et al. | |
| 6,432,760 B1 | 8/2002 | Kothandaraman et al. | |
| 6,436,747 B1 | 8/2002 | Segawa et al. | |
| 6,633,055 B2 | 10/2003 | Bertin et al. | |
| 6,690,083 B1 | 2/2004 | Mitchell et al. | |
| 7,411,227 B2 | 8/2008 | Amos et al. | |
| 7,572,724 B2 | 8/2009 | Nowak et al. | |
| 7,592,216 B2 | 9/2009 | Lin et al. | |
| 7,622,345 B2 | 11/2009 | Ting et al. | |
| 7,655,557 B2 | 2/2010 | Amos et al. | |
| 7,723,178 B2 | 5/2010 | Adkisson et al. | |
| 7,749,822 B2 | 7/2010 | Freeman et al. | |
| 7,776,757 B2 | 8/2010 | Lin et al. | |
| 2007/0194390 A1 | 8/2007 | Chinthakindi et al. | |
| 2008/0258232 A1 | 10/2008 | Mizumura | |
| 2010/0019344 A1 | 1/2010 | Chuang et al. | |
| 2010/0032811 A1* | 2/2010 | Ding et al. | 257/621 |
| 2010/0059823 A1 | 3/2010 | Chung et al. | |
| 2010/0078727 A1 | 4/2010 | Min et al. | |
| 2010/0144106 A1* | 6/2010 | Cho et al. | 438/243 |

FOREIGN PATENT DOCUMENTS

| | | |
|---|---|---|
| JP | 11330375 A | 11/1999 |
| JP | 2004281918 A | 10/2004 |

OTHER PUBLICATIONS

U.S. Appl. No. 12/823,168, filed Jun. 25, 2010 Title: Method of Forming a Shallow Trench Isolation Embedded Polysilicon Resistor Inventor: H. Shang, et al.

* cited by examiner

*Primary Examiner* — Alexander Ghyka
(74) *Attorney, Agent, or Firm* — Joseph P. Abate

(57) ABSTRACT

A method includes providing a substrate having insulating layers thereon; forming a first trench in a first region of the substrate and a second trench in a second region of the substrate; thermally growing layers of oxide along the sides of the trenches; filling the first trench and the second trench with a polysilicon material, planarizing the polysilicon material, and creating a shallow trench isolation between the first region and the second region, wherein the step f) of creating the shallow trench isolation is performed only after the steps of d) filling and e) planarizing.

22 Claims, 14 Drawing Sheets

FURTHER DETAILS FOR EFUSE:

1. BASE CMOS PROCESS FLOW UP TO SOURCE/DRAIN FORMATION, WHICH INCLUDES PROCESSING OF WELL IMPLANTS, GATE PATTERNING, HALO/EXT IMPLANTS, SOURCE/DRAIN FORMATION. EFUSE POLYSILICON IS BLOCKED FOR ALL THESE IMPLANTS. NO IMPLANT IS REQUIRED FOR EFUSE.

2. SILICIDATION IS DONE IN THE EFUSE AREA ALONG WITH OTHER CMOS DEVICES.

3. A CVD TENSILE NITRIDE STRESS LINER IS DEPOSITED IN THE EFUSE DEVICES ALONG WITH THE OTHER DEVICES.

4. CONTACT AND METAL CONNECTIONS ARE FORMED TO ACCESS THE EFUSE. IT'S A COMMON PROCESS SHARED FOR ALL THE DEVICES OFFERED IN THE TECHNOLOGY.

*FIG. 11A*

FURTHER DETAILS FOR RESISTOR:

1. BASE CMOS PROCESS FLOW UP TO SOURCE/DRAIN FORMATION, WHICH INCLUDES PROCESSING OF WELL IMPLANTS, GATE PATTERNING, HALO/EXT IMPLANTS, SOURCE/DRAIN FORMATION. RESISTOR IS BLOCKED FOR ALL THESE IMPLANTS. RESISTOR GETS SPECIFIC IMPLANTS USING A RESISTOR IMPLANT MASK (RP MASK).

2. A SILICON NITRIDE   USING A CVD PROCESS

3. SILICIDATION IS DONE AT THE RESISTOR ENDS ALONG WITH THE SILCIDIC FORMATION OF OTHER DEVICES.

4. CONTACT AND METAL CONNECTIONS ARE FORMED TO ACCESS THE RESISTOR. IT'S A COMMON PROCESS SHARED FOR ALL THE DEVICES OFFERED IN THE TECHNOLOGY.

*FIG. 11B*

METHOD OF FABRICATING AN EMBEDDED POLYSILICON RESISTOR AND AN EMBEDDED EFUSE ISOLATED FROM A SUBSTRATE

FIELD OF THE INVENTION

The present invention relates generally to the fabrication of integrated circuit semiconductor devices and, more particularly, to a method of fabricating an electrical fuse (eFuse/efuse/Efuse) and a precision polysilicon resistor each having a body embedded in and isolated from a semiconductor substrate.

BACKGROUND

To make integrated circuits (ICs), such as memory devices and logic devices, having a high integration density the industry generally downscales the dimensions of field effect transistors (FETs), such as metal-oxide-semiconductor field effect transistors (MOSFETs), and passive devices, such as semiconductor resistors and eFuses. Scaling achieves compactness and improves the operating performance in devices by shrinking the overall dimensions of the devices while maintaining the electrical properties of the devices. Generally, all the dimensions of a device are typically scaled simultaneously in order to optimize its electrical performance.

Silicided polysilicon eFuses and polysilicon resistors are widely used in today's semiconductor products because of their superior performance over many other solutions. These eFuses are known for a highly reliable silicide electromigration at acceptable current levels. Polysilicon resistors can outperform many other semiconductor resistors by means of a highly accurate resistivity, low temperature coefficiency and low parasitic capacitance. In many conventional CMOS device fabrication technologies, these eFuses and polysilicon resistors typically share a same polysilicon material, which is also used to create the gate electrode for a CMOS transistor. During patterning of the gate electrode structure, the bodies of the eFuses and resistors can also be created with the required dimensions of the polysilicon. In general, a polysilicon silicide wire having a minimum width is used for eFuse applications. The size of a resistor can be determined based on the basic specific resistance value of the polysilicon material and subsequent type and concentration of dopant material that can be incorporated into the resistor to adjust the resistance value. Also, both the eFuse and the resistor properties change dramatically whenever the gate electrode fabrication process changes affecting the gate height, the gate doping, and the gate integration. Further, certain conventional CMOS device fabrication technologies create electrical isolations such as Shallow Trench Isolations or local oxidation of silicon (LOCOS) to isolate devices electrically. Shallow Trench Isolations (STI) separate regions of two adjacent devices, minimizing the electrical interaction between the two devices and reducing the capacitive coupling or leakage between them. See, for example, U.S. Pub. Nos. US 2010/0019344A1, NOVEL POLY RESISTOR AND POLY EFUSE DESIGN FOR REPLACEMENT GATE TECHNOLOGY, BY Chuang et al, published Jan. 28, 2010. and US 2010/0059823A1, RESISTIVE DEVICE FOR HIGH-K METAL GATE TECHNOLOGY AND METHOD OF MAKING, by Chung et al, published Mar. 11, 2010, which are both incorporated in their entireties herein by reference.

SUMMARY

The present invention provides a method of fabricating bodies for a polysilicon eFuse and a polysilicon resistor. According to a preferred embodiment of the invention, a polysilicon material is deposited in insulated deep trenches and then planarized before fabricating shallow trench isolations during, for example, an otherwise conventional method of CMOS device fabrication.

An advantage of a method according to an embodiment of the present invention is that the method decouples creating the polysilicon material bodies of the eFuse and the resistor from creating the gate electrode of a CMOS transistor, thus making the eFuse and the resistor bodies immune to gate electrode-related fabrication issues. The present inventive method is useful in, for example, a typical replacement metal gate CMOS device fabrication technology (i.e. a "gate last" fabrication process/method) in which a polysilicon gate electrode is removed and replaced with a high-K dielectric and a metal gate to improve the CMOS transistor performance. See, for example, U.S. Pat. No. 6,406,956, POLY RESISTOR STRUCTURE FOR DAMASCENE METAL GATE, by Tsai, et al, issued Jun. 18, 2002, which is incorporated in its entirety herein by reference herein.

According to the preferred embodiment of the invention, a method includes a) providing a semiconductor substrate having insulating layers thereon; b) forming a first trench in a first region of the substrate and a second trench in a second region of the substrate; c) thermally growing layers of oxide along the sides of the trenches; d) filling the trenches with a polysilicon material; e) planarizing the polysilicon material; f) creating a shallow trench isolation between the first region and the second region, wherein the step f) of creating the shallow trench isolation is performed only after the steps of d) filling and e) planarizing the polysilicon material.

BRIEF DESCRIPTION OF THE DRAWINGS

The accompanying drawing figures, which are incorporated in and which constitute part of the specification, illustrate the presently preferred embodiments of the invention which, together with the general description given above and the detailed description of the preferred embodiments given below, serve to explain the invention further wherein like reference numerals denote like elements and parts.

FIG. 11A is a list of further details for method steps applicable to the fabrication of an embedded eFuse.

FIG. 11B is a list of further details for method steps applicable to the fabrication of an embedded polysilicon resistor.

DETAILED DESCRIPTION

Detailed embodiments of the present invention are disclosed hereinafter. However, it is to be understood that the disclosed embodiments are merely illustrative of the invention that can be embodied in various forms. In addition, each of the examples given in connection with the various embodiments of the invention is therefore intended to be illustrative and not restrictive. Furthermore, the figures are not necessarily drawn to scale, some features being sometimes exaggerated to show details of particular components. Therefore, specific structural and functional details disclosed herein are not to be interpreted as limiting, but merely as a representative basis for teaching one skilled in the art to variously employ the present invention.

When describing the following structures and methods, the following terms have the following meanings, unless otherwise indicated.

The term "direct contact" or "directly on" means that a first element, such as a first structure, and a second element, such as a second structure, are physically in contact without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

Figure 1:
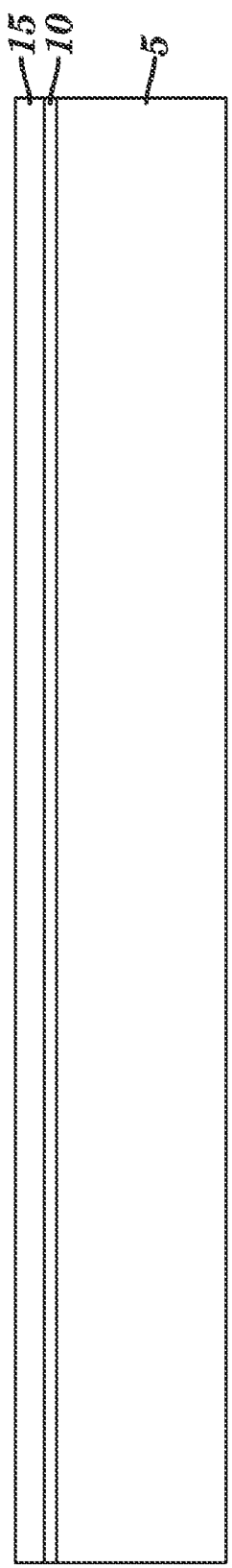
FIG. 1 is a side schematic cross-sectional view of a semiconductor substrate 5 (e.g., p-type bulk silicon substrate) having a thermally grown pad oxide layer 10 and a pad nitride layer 15 deposited on the layer 10. The substrate 5, the layers 10, 15 and respective dimensions are conventional, for example, a "gate last" CMOS device fabrication process.

FIG. 1 depicts providing a semiconductor substrate 5 with a first insulating layer 10 of $SiO_2$ (quartz) having a thickness of approximately (±10%) 5 nm, and with a second insulator layer 15, preferably made of SiN, having a thickness of approximately 50 nm disposed directly on the layer 10.

The substrate 5 is made of any suitable semiconductor material including, but not limited to, Si, strained Si, SiC, SiGe, Si alloys, Ge, Ge alloys, GaAs, InGaAs, and InP, or any combination thereof.

Figure 2:
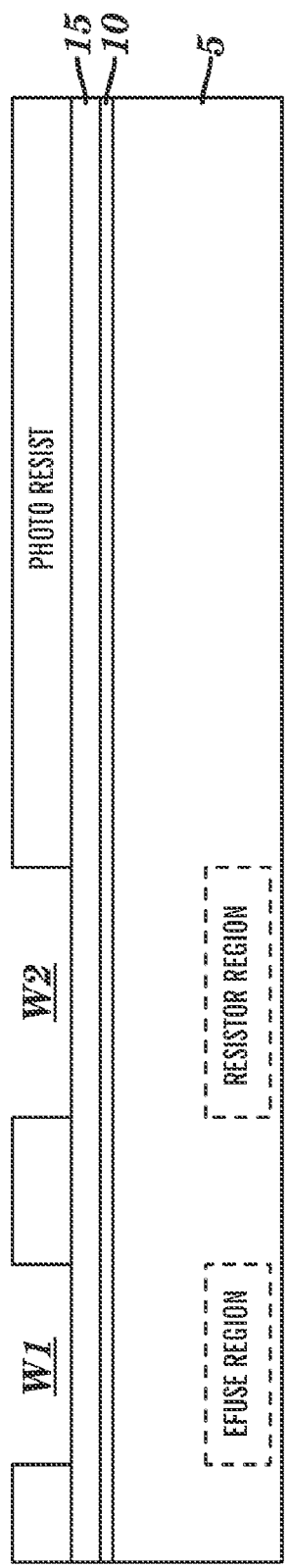
FIG. 2 is a side schematic cross-sectional view of windows W1, W2 patterned for etching the pad oxide and nitride layers 10, 15, while leaving the remainder of the structure covered by a photoresist 20.

Referring to FIG. 2, a photoresist layer 20 with a thickness of approximately 180 nm is deposited and then patterned to open windows W1, W2 in a first region and a second region. The first and second regions are the regions above the dashed boxes labeled eFuse region and resistor region. Window dimensions depend on the desired electrical properties of the eFuse and the resistor, all as would be well understood by those skilled in the art in view of the FIGS. 1-12 and description. In general, a minimum width polysilicon line body, which is the same as the gate electrode length of an FET device used in the same technology, with a length being approximately 10 times that of the width is used for eFuse applications. The thinner the width of the polysilicon line body the better is the programmability of the eFuse (eFuse programmability). On the other hand, the window dimensions for the resistor are determined by well known doping parameters and the desired resistor value. Proper width and other dimensions of the windows and all devices are well understood by those skilled in the art in view of the present specification and figures and need not be further discussed in detail.

The eFuse programmability means a change in the fuse resistance after programming. Typical pre-program resistance ranges between approximately 100 ohms to approximately 150 ohms and post-program fuse resistance should be at least approximately 10K ohms. See, for example, U.S. Pat. Nos. 6,432,760, (METHOD AND STRUCTURE TO REDUCE THE DAMAGE ASSOCIATED WITH PROGRAMMING ELECTRICAL FUSES), 7,572,724 and 7,749,822, which are all incorporated by reference in their entireties herein.

The resistor body to be fabricated through the patterned window W2 can have, for example, a sheet resistance ranging between approximately 300 ohms/square and approximately 1000 ohms/square. See, for example, U.S. Pat. No. 6,406,956, U.S. Pat. No. 7,749,822. See also U.S. patent application Ser. No. 12/823,168 filed Jun. 25, 2010, titled: METHOD OF FORMING A SHALLOW TRENCH ISOLATION EMBEDDED POLYSILICON RESISTOR, assigned to International Business Machines Corporation (assignee herein).

Figure 3:
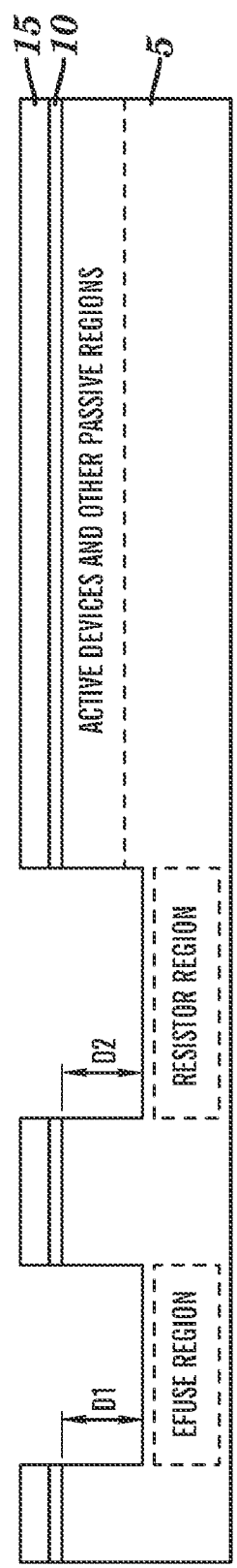
FIG. 3 is a side schematic cross-sectional view of the nitride layer 15, the pad oxide layer 10, and the silicon substrate 5 etched through the windows W1, W2 opened in first and second regions (regions above respectively dashed boxes—labeled Efuse region, Resistor region), and then followed by a conventional photoresist 20 removal step.

Referring now to FIG. 3, the pad nitride and oxide layers 15, 10 are etched and trenches are formed in the silicon substrate 5 by using an integrated anisotropic etching process, such as reactive-ion etching (RIE) or plasma etching. The depths D1, D2 of the trenches are determined based on the eFuse and resistor electrical behavior desired and are well understood by those skilled in the art in view of the instant specification. The trenches can have equal or unequal depths D1, D2, which can be in a range of approximately 150 nm to approximately 300 nm depending also, of course, on the technology node.

Figure 4:
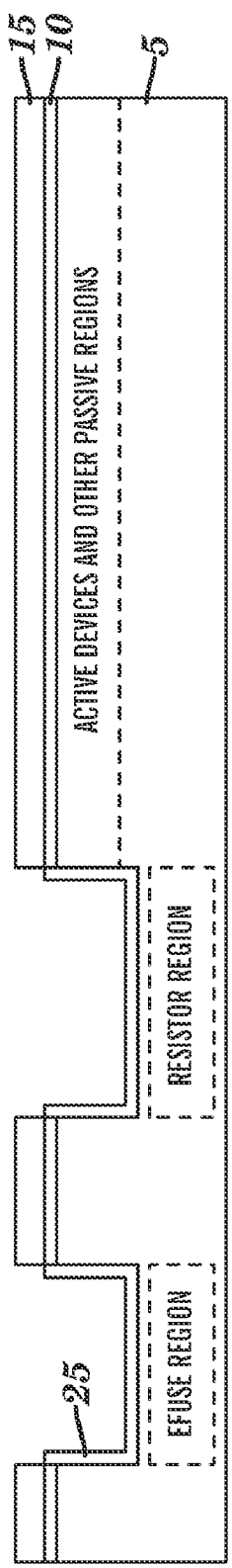
FIG. 4 is a side schematic cross-sectional view of oxide insulator layers 25 thermally grown in the silicon trenches.

Referring to FIG. 4, thermal oxide layers 25 are grown in the trenches using a wet oxidation process to isolate a polysilicon material 30 (FIG. 5) from the substrate 5. The thicknesses of the layers 25 are determined primarily for effective eFuse performance. Because the electromigration properties of an eFuse (eg, FIG. 12A or in the '760 patent) depend on the local heat generated in the eFuse element, the thickness of each oxide isolation layer 25 should be enough to minimize the heat transfer between the polysilicon material 30 and the bulk silicon 5. For the resistor, thick oxide isolation reduces parasitic capacitance and substrate noise. The thickness of each layer 25 is in a range of, for example, from approximately 20 nm to approximately 50 nm.

The layers 25 can be $SiO_2$ by means of a conventional wet oxidation process, or a SiON (silicon oxynitride).

Figure 5:
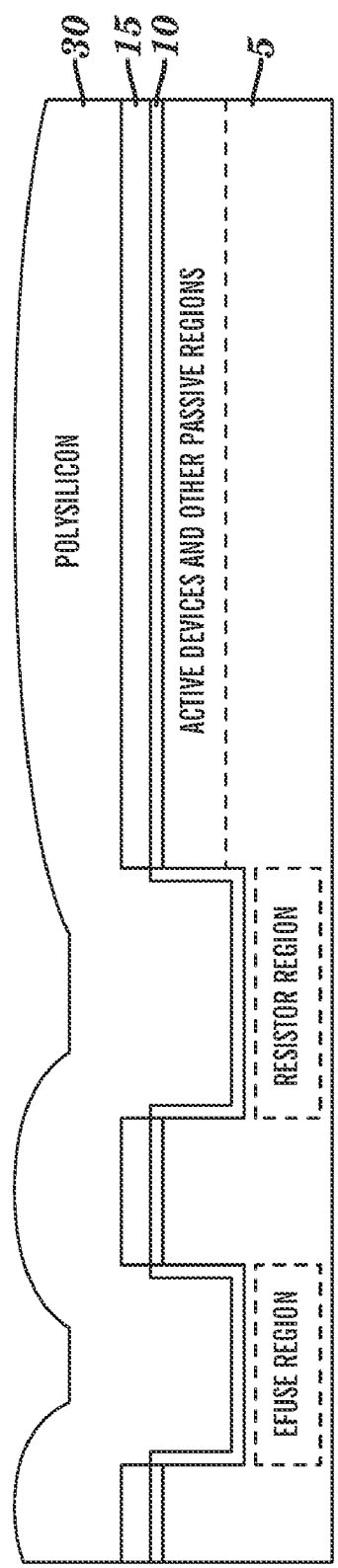
FIG. 5 is a side schematic cross-sectional view of a blanket polysilicon material 30 deposited on the layers 25 and to fill the trenches.

Referring now to FIG. 5, a thick polysilicon layer 30 is deposited with a conventional low pressure chemical vapor deposition (LPCVD) process to fill the trenches; an operation (step) preferably performed in a furnace. A CVD process allows conformal deposition of the polysilicon material 30 to cause the polysilicon material to be void free.

Figure 6:
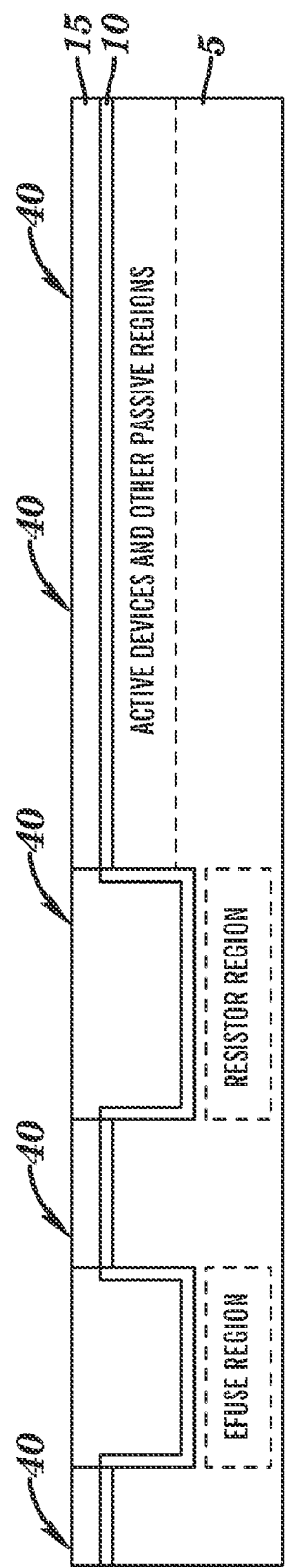
FIG. 6 is a side schematic cross-sectional view of the structure after planarizing the surfaces 40 with a stop on the nitride (dielectric) layer 15 to remove the polysilicon material from the first region, the second region and the active devices and other passive devices regions, which leaves polysilicon 30 in the trenches for use in fabricating eFuse and resistor devices.

Referring to FIG. 6, a CMP operation is performed to result in planarized surfaces 40 to remove the polysilicon from all areas (except in the patterned windows and the trenches) and stopping at the SiN layer 15. The planarization process, preferably a conventional chemical-mechanical polishing (CMP), is used to provide the planar surfaces. Other known techniques can be used with similar results.

Figure 7:
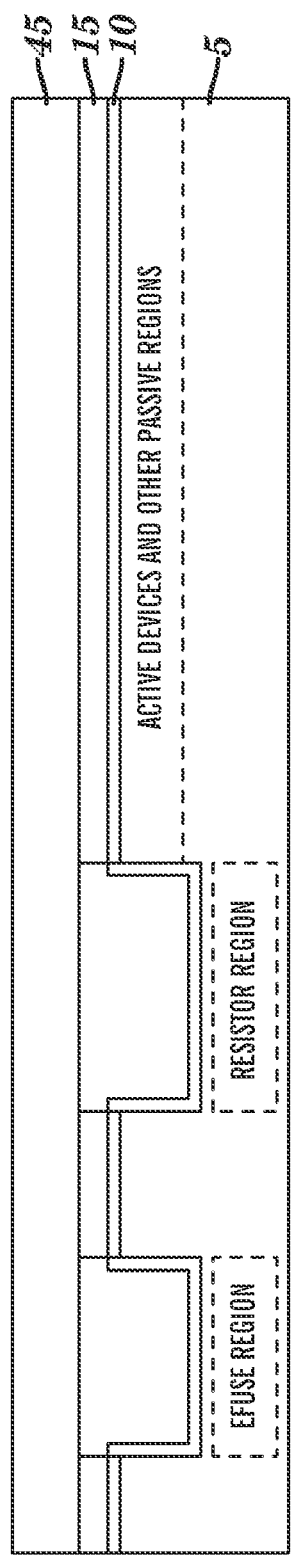
FIG. 7 is a side schematic cross-sectional view of an additional pad nitride layer 45 deposited for use in fabricating shallow trench isolations (STIs) to isolate the eFuse, the resistor and other devices such as Field Effect Transistors to be fabricated in and above regions FET1, FET2 as shown in FIG. 8.

Referring now to FIG. 7, a fresh pad nitride layer 45 is deposited. The pad nitride layer 45 thickness can be, for example, in a range of approximately 50 nm to approximately 100 nm, and adjusted to match the total nitride thickness of, for example, approximately 80 nm to approximately 100 nm.

Still referring to FIG. 7, a gate last CMOS device integration process (individually conventional steps) can now be used to fabricate FET transistors (not shown) and need not be further discussed. Gate last is also often referred to as a replacement metal gate process. See, for example, U.S. Pat. No. 7,776,757 and U.S. Pub. No. U.S. 2010/0019344, both incorporated by reference herein in their entireties. However, for further clarity, certain steps for fabricating STIs are discussed briefly with respect to FIGS. 8 and 9.

Figure 8:
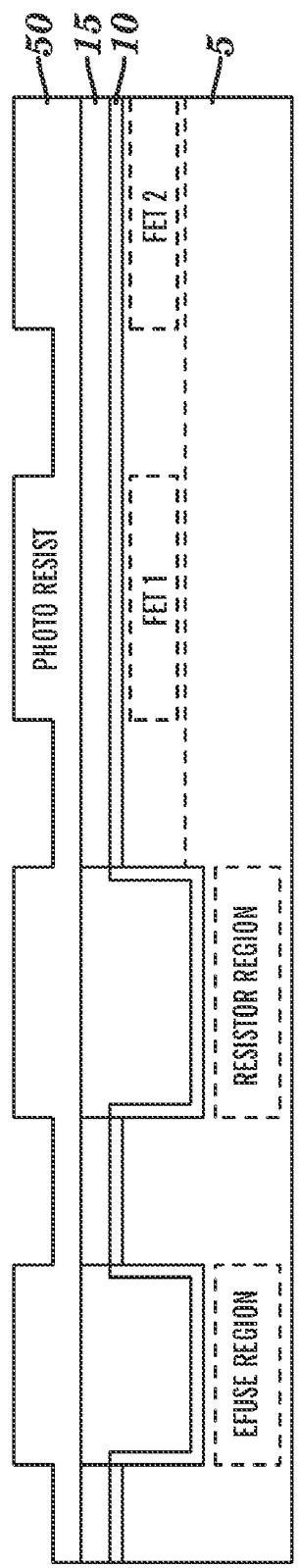
FIG. 8 is a side schematic cross-sectional view of windows etched in a deposited photoresist layer 50 through which the pad nitride layer 45 will be removed for fabricating the STIs.

Referring now to FIG. 8, a side cross-sectional view illustrates the patterning process for creating isolations between the eFuse and resistor bodies. A photoresist 50 is applied and etched for the windows in the regions where shallow trench isolations (STIs) are needed. This patterning is generally effected by any known advanced lithography process. Currently a 193 nm immersion process is an industry standard. See, also, U.S. Pat. No. 7,723,178, SHALLOW AND DEEP TRENCH ISOLATION STRUCTURES IN SEMICONDUCTOR INTEGRATE CIRCUITS, issued May 25, 2010 by Adkinson et al., which is incorporated by reference herein in its entirety.

Figure 9:
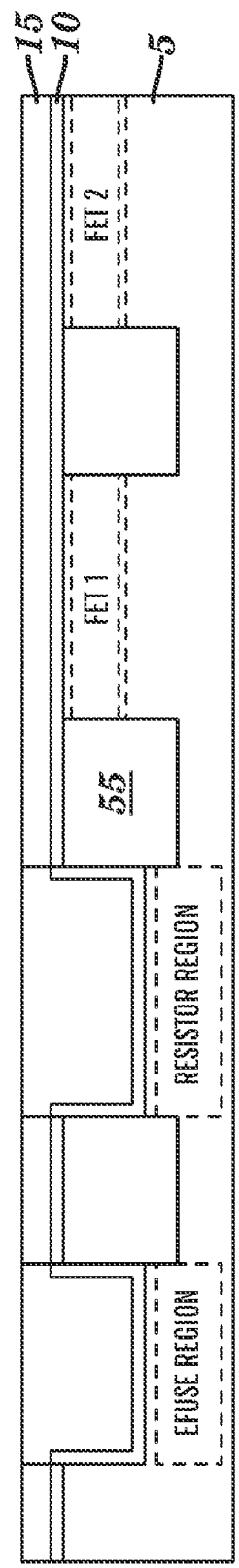
FIG. 9 illustrates a side schematic cross-sectional view of the structure after fabricating STIs 55, which includes, for example, 1) etching of the pad nitride layer 45; 2) etching through the layers 15, 10 and a suitable depth into the silicon substrate 5 to form trenches; 3) silicon oxynitride liner formation in the trenches; 4) filling the trenches with a deposited oxide material; 5) planarizing the surface of the oxide material to remove deposited oxide on the pad nitride layer; 6) removing the pad nitride layer, and 7) further planarizing the surface to remove oxide irregularities resulting, for example, from step 6.

Referring to FIG. 9, a cross sectional view of the devices at the end of the STI fabrication is shown. STIs 55 of various sizes are formed using conventional methods. The method of forming the STIs includes, among others, STI RIE etching ranging from 300 to 350 nm, followed by STI liners, preferably 2 nm to 3 nm thick, and filling the hole of the STI with silicon oxide (SiO), preferably using a filling process required to achieve a complete fill, such as the HARP (High Aspect Ratio Process). The region between the STIs is reserved for active and passive devices, such as but not limited to FETs (RX patterning). Certain semiconductor devices use an intrinsic semiconductor material that has been doped—i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The semiconductor device can be a field effect transistor (FET), such as a metal oxide semiconductor field effect transistor (MOSFET), or a polysilicon/single crystal silicon resistor.

Figure 10:
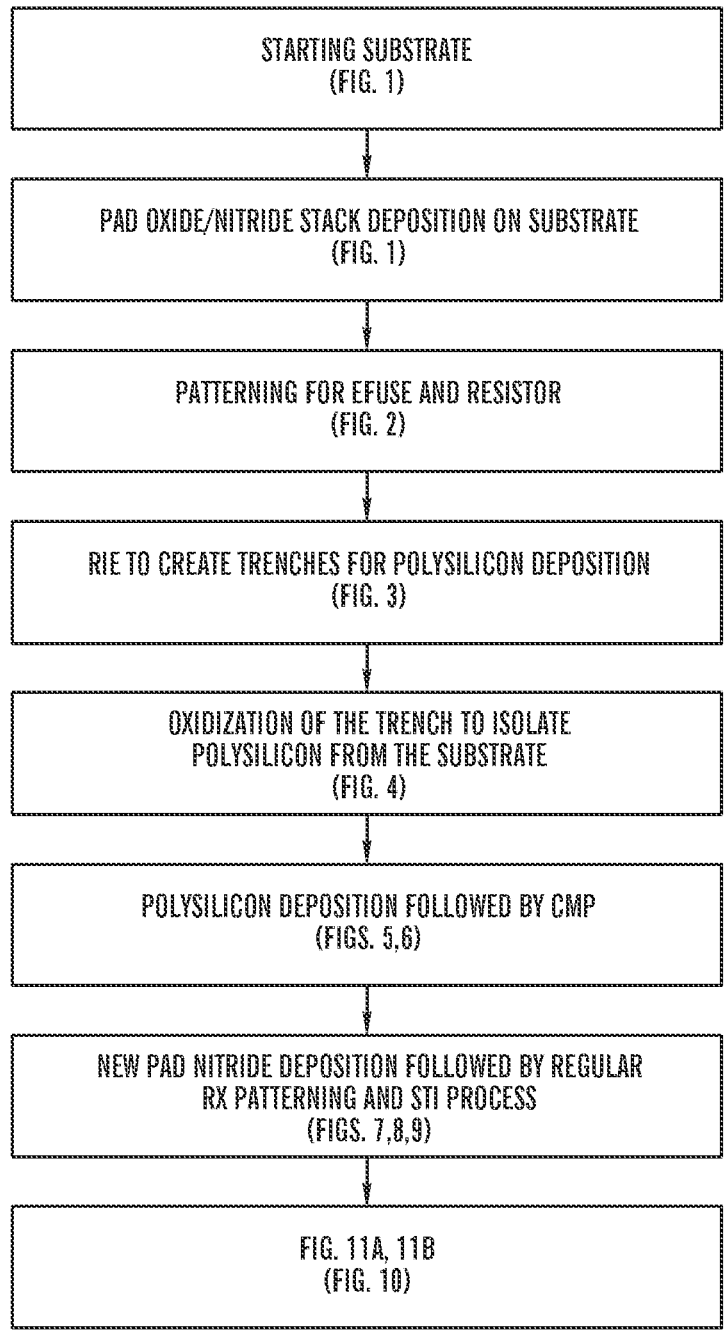
FIG. 10 is a flow diagram showing the method (process) steps of the preferred embodiment of the present invention keyed to corresponding other figures.

FIG. 10 is a flow diagram according to the embodiment of the invention.

FIGS. 11A and 11B are (eg., no doping) listings of further details applicable to fabrication of an eFuse and a resistor, respectively. As is well understood by those skilled, the resistor is doped independently from the eFuse (eg, no doping) and other devices by using a separate well known mask known as an RP mask. A window is opened in the photoresist for the resistor region and various dopant elements such as Boron, BF2, C etc. are implanted depending on the resistor requirements. A typical resistor with a sheet resistance of 350 ohms/square needs a BF2 doping concentration in the range of approximately $10^{18}/cm^3$. On the other hand, un-doped polysilicon is used for the eFuses.

Figure 12A:
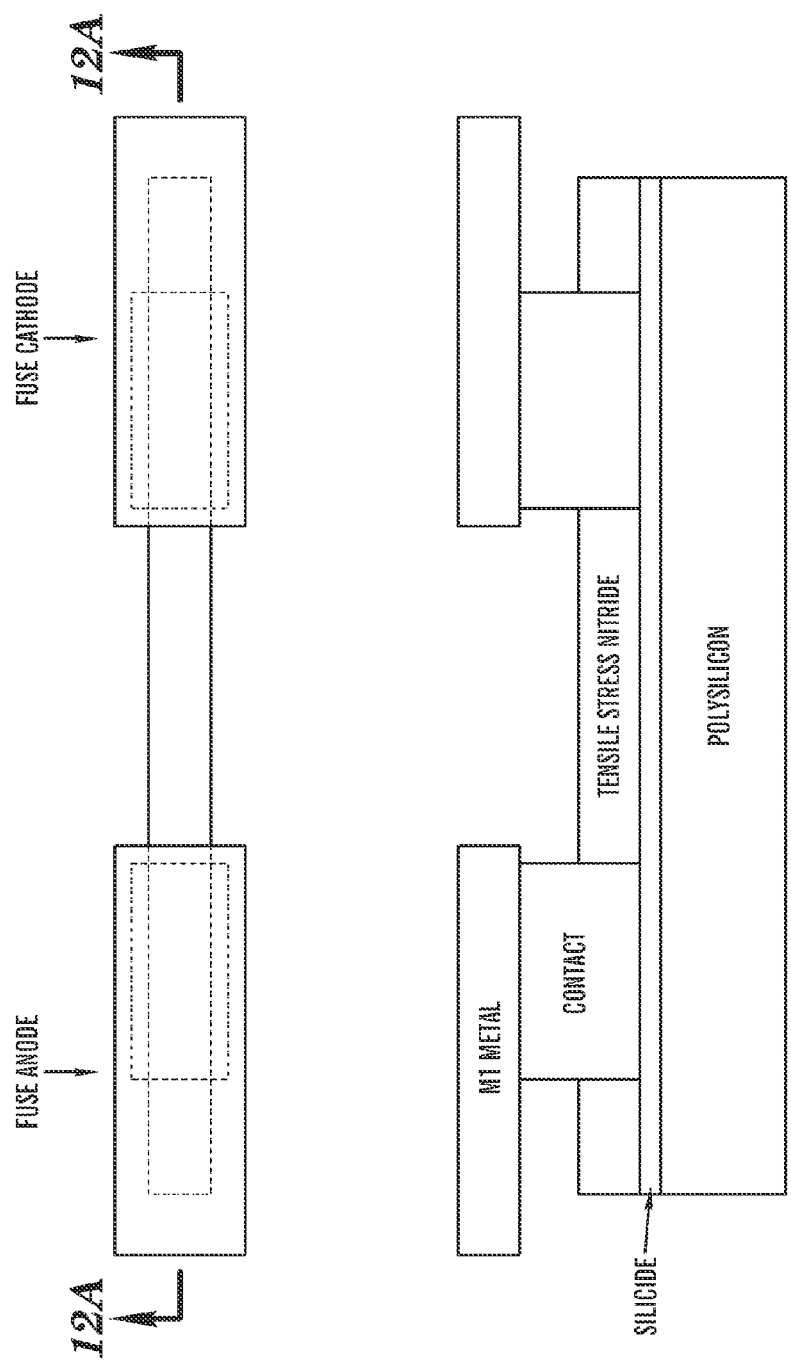
FIG. 12A shows top planar and side sectional schematic views of a conventional embedded polysilicon eFuse fabricated according to the embodiment of the present invention.
Figure 12B:
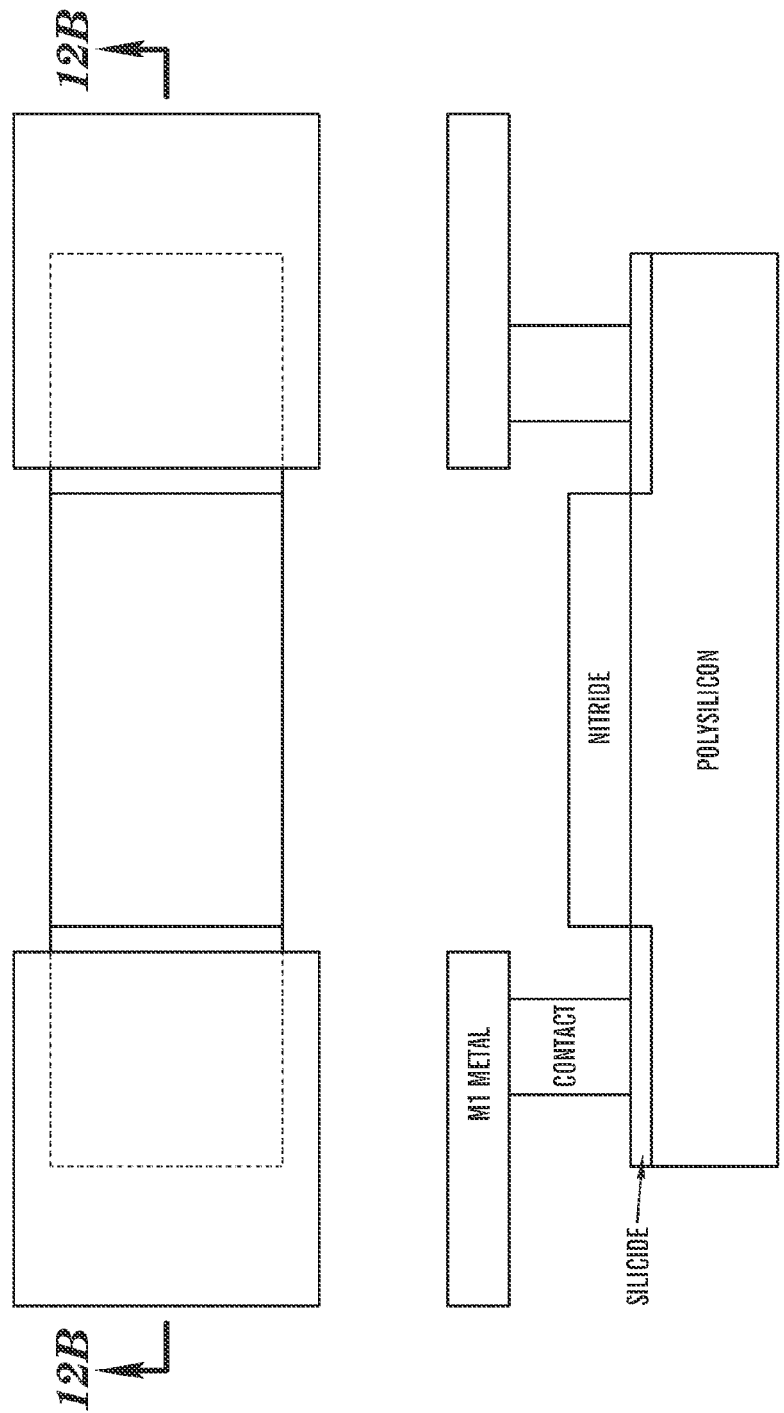
FIG. 12B shows top planar and side sectional views of a conventional polysilicon resistor fabricated according to the embodiment of the present invention.

FIGS. 12A and 12B are top and side views of details for the eFuse and the resistor, respectively. The eFuse receives silicidation, contacts, (eg, metal) and a stress nitride as shown in FIG. 12A. The resistor receives an RP implant (doping not shown), partial silicidation and contacts (e.g., metal) as shown in FIG. 12B. The parts of the eFuse and the resistor are conventional (except for the sequence of method steps claimed herein) and thus these parts need not be further discussed.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method for fabricating an eFuse and a resistor, comprising:
    a) providing a substrate having insulating layers thereon;
    b) forming a first trench in a first region of the substrate and a second trench in a second region of the substrate;
    c) thermally growing layers of oxide along the sides of the trenches, the layers of oxide having an approximately uniform equal thickness in a range of a approximately 20 nm to approximately 50 nm, the oxide being $SiO_2$;
    d) filling the first trench and the second trench with a polysilicon material,
    e) planarizing the polysilicon material;
    f) creating a shallow trench isolation between the first region and the second region, wherein the step f) of creating the shallow trench isolation is performed only after the steps of d) filling and e) planarizing, and then g) creating an eFuse in the first region and a resistor in the second region.

2. The method as claimed in claim 1, wherein the first trench and the second trench have approximately equal depths into the substrate.

3. The method as claimed in claim 1, wherein said step of planarizing includes chemically mechanically polishing the polysilicon material.

4. The method as claimed in claim 1, wherein said step b) of forming includes anisotropically etching the trenches.

5. The method as claimed in claim 4, wherein said anisotropically etching includes reactive ion etching the trenches.

6. The method as claimed in claim 1, where said step d) of filling comprises using an LCPVD process to fill the trenches.

7. The method as claimed in claim 1, wherein said step c) includes using a wet oxidation process.

8. The method as claimed in claim 2, wherein the approximately equal depths are in a range of approximately 150 nm to approximately 300 nm.

9. The method as claimed in claim 1, wherein said step d) filling includes depositing the polysilicon material using an LPCVD process.

10. The method as claimed in claim 1, wherein said step e) planarizing including chemically mechanically polishing the polysilicon material.

11. The method as claimed in claim 1, wherein said step f) creating a shallow trench isolation includes depositing a nitride layer directly onto the polysilicon material.

12. A method for fabricating an eFuse and a resistor, comprising:
   a) providing a substrate having insulating layers thereon;
   b) forming a first trench in a first region of the substrate and a second trench in a second region of the substrate;
   c) thermally growing layers of oxide along the sides of the trenches, the layers of oxide having an approximately uniform equal thickness in a range of approximately 20 nm to approximately 50 nm, the oxide being SiON;
   d) filling the first trench and the second trench with a polysilicon material;
   e) planarizing the polysilicon material;
   f) creating a shallow trench isolation between the first region and the second region,
   wherein the step f) of creating the shallow trench isolation is performed only after the steps of d) filling and e) planarizing, and then
   g) creating an eFuse in the first region and a resistor in the second region.

13. The method as claimed in claim 12, wherein the first trench and the second trench have approximately equal depths into the substrate.

14. The method as claimed in claim 12, wherein said step of planarizing includes chemically mechanically polishing the polysilicon material.

15. The method as claimed in claim 12, wherein said step b) of forming includes anisotropically etching the trenches.

16. The method as claimed in claim 15, wherein said anisotropically etching includes reactive ion etching the trenches.

17. The method as claimed in claim 12, where said step d) of filling comprises using an LCPVD process to fill the trenches.

18. The method as claimed in claim 12, wherein said step c) includes using a wet oxidation process.

19. The method as claimed in claim 13, wherein the approximately equal depths are in a range of approximately 150 nm to approximately 300 nm.

20. The method as claimed in claim 12, wherein said step d) filling includes depositing the polysilicon material using an LPCVD process.

21. The method as claimed in claim 12, wherein said step e) planarizing including chemically mechanically polishing the polysilicon material.

22. The method as claimed in claim 12, wherein said step f) creating a shallow trench isolation includes depositing a nitride layer directly onto the polysilicon material.

* * * * *